United States Patent [19]

Rovnjev

[11] 4,241,153

[45] Dec. 23, 1980

[54] PROCESS FOR MAKING COLOR SEPARATION NEGATIVES AND POSITIVES FOR USE IN MULTI-COLOR PRINTING

[75] Inventor: Vjatsjeslev Rovnjev, Oslo, Norway

[73] Assignee: AB Bates a/s, Oslo, Norway

[21] Appl. No.: 955,726

[22] Filed: Oct. 27, 1978

[30] Foreign Application Priority Data

Oct. 28, 1977 [NO] Norway ................................ 773692
Oct. 3, 1978 [NO] Norway ................................ 783339

[51] Int. Cl.² ........................... G03C 5/00; G03F 5/00
[52] U.S. Cl. ........................................... 430/4; 430/6;
430/9; 430/300; 430/307; 430/356; 430/394;
430/396
[58] Field of Search ........................ 430/4, 6, 7, 9, 11,
430/300, 307, 356, 394, 396, 949

[56] References Cited

U.S. PATENT DOCUMENTS

| | | | |
|---|---|---|---|
| 3,413,119 | 11/1968 | St. Clair et al. | 430/396 X |
| 3,977,872 | 8/1976 | Hellmig | 430/396 X |
| 4,012,257 | 3/1977 | Geris | 430/307 X |

*Primary Examiner*—Edward C. Kimlin
*Attorney, Agent, or Firm*—Blum, Kaplan, Friedman, Silberman & Beran

[57] ABSTRACT

Negative and positive films for use in multi-color printing are prepared by a process which utilizes crystals and interstices therebetween in color-separation negatives for multi-color printing without the use of half-tone screens. Exposure through masks of controlled density ranges relative to the color-separation negatives and positives prepared from the color original result in final negatives and positives as well as duplication negatives and positives which can be utilized in the multi-color printing process.

27 Claims, 12 Drawing Figures

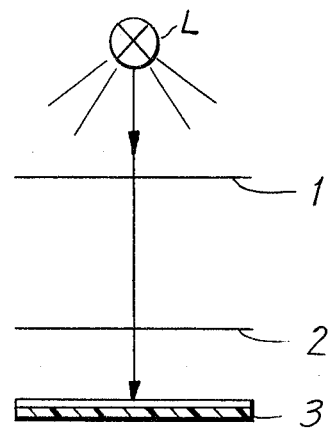
FIG. 1A
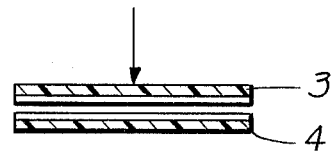
FIG. 1B
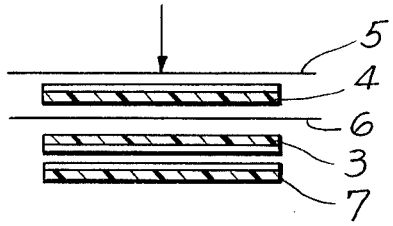
FIG. 1C
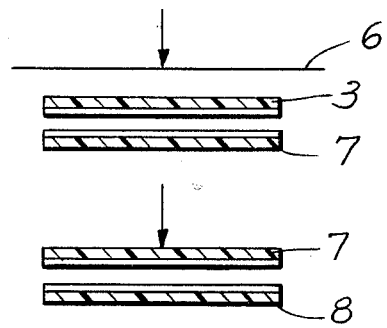
FIG. 1C'
FIG. 1D
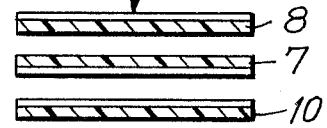
FIG. 1E
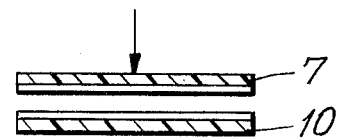
FIG. 1E'

PROCESS FOR MAKING COLOR SEPARATION NEGATIVES AND POSITIVES FOR USE IN MULTI-COLOR PRINTING

BACKGROUND OF THE INVENTION

The lithographic (offset) printing method for multi-color prints using the so-called color-separation technique generally comprises photographing the color original to be reproduced through color filters for obtainment of continuous-tone negatives, i.e. the so-called separation negatives. As color original, a color transparency is usually employed which is separated on a conventional film for separation negatives with a range of 1.6–1.8 and with a sensibility of e.g. 40–50 ASA, and from this separation negative a screen positive is made on a lith film. Screen-free color-separation negatives (continuous-tone negatives) prepared in the above-mentioned manner are then illuminated through a screen and directly onto a new film.

However, the screen may also be introduced into the system by illuminating the color original through the color filter and a screen and onto a negative film ("direct screening") thereby obtaining a color-separation negative with screen pattern (halftone negatives) which will be found in the printed copy of the original.

In multi-color printing a printing form is produced for each color to be printed. In three-color printing the printing inks used are yellow, cyan and magenta, however, usually it is printed in four colors with black as correction color, and the colors are usually, but not necessarily, printed in this sequence.

Thus, in the conventional lithographic (offset) multi-color printing process the printing form is prepared and developed with a photographed screen pattern, and this screen pattern will be transferred to the printed copy of the original and constitute a foreign element therein with regard to the original. However, there are often problems with the screen method, particularly when used for high speed printing of the image as this may easily become blurred. For conventional four-color auto-illustrations for newspapers and magazines printed in letter-press there must also technical reasons be used a relatively coarse screen, e.g. having from 20 to 24 lines per linear cm.

A well-known basic method for reproducing color originals and which involves preparing three color-separation negative screens corresponding to the three primary colors, and in certain cases also a black correction negative, is disclosed e.g. in U.S. Pat. Nos. 1,843,872 and 1,885,725.

When gravure cylinders for multi-color printing are to be produced it is also known to prepare color-separation positives from the corresponding color-separation negatives. When separation negatives obtained by photographing the original through a red filter are used for the preparation of the separation positive the resultant product is a cyan color-separation positive. The separation negative obtained by photographing the color original through a green filter will result in a magenta separation positive, and the separation negative obtained by photographing the color original through a blue filter will result in a yellow separation positive. There is also frequently prepared a black color-correction positive because even the highest qualities cyan, magenta and yellow printing inks do not combine to form a neutral black as theory would dictate. The correction positive will make up for this tonal irregularity in practice, so that when the three colors are combined, a neutral black is ultimately achieved. Reference may in this connection be made to British patent specification No. 1,136,464.

The four color-separation positives are then used for preparing the gravure printing plates to be used for the multi-color printing. This preparation of gravure printing plates is well known within the art and will here not be further explained, however, reference can be made to U.S. Pat. No. 3,179,519.

Throughout the world the printing processes, relief (flexography, letterpress), planographic (offset), intaglio (gravure) and porous (screen process) are in daily use. As regards the reproduction of tonal values there is a substantial difference between the intaglio (gravure) process and the other printing processes although they have all hitherto used a so-called screen.

In gravure printing the function of the intaglio screen is to divide the printing surface into so-called steps which support the doctor blade, i.e., the knife which scrapes the printing ink from the surface of the printing form, and into wells which contain the printing ink. The wells are etched into the printing form, and it is the depth of the etched well which determines the amount of printing ink and thereby the thickness of the printing ink layer transferred to the paper. That the concentration of the color pigments varies over the printing surface and results in variable light absorption is characteristic of what is termed a genuine half-tone. The other printing processes may only transfer the color layer with uniform thickness over the entire printing surface. In order to obtain different tonal values (varying light absorption) with these other printing processes the printing surface must be divided into very small printing and non-printing areas so that to the eye these are mixed into tonal values.

This division is usually done with a so-called autotypic or halftone screen. There are many different types and techniques; however, it may be generally stated that the screen divides the printed image into large and small dots related to the tonal values of the original. All dots are equally spaced, however, the number thereof per $cm^2$ depends upon the fineness of the screen. The size of the dot is stated in percent of the completely covered surface and the fineness in number of lines per cm. The finer the screen, the better the reproduction of details for a certain size; however, the screen must be selected with due consideration to printing technique and paper quality. Herein resides some of the limitation of the screen technique, i.e. that sharpness and reproduction of details are dependent upon the printing technique and the paper quality.

If the printed colors of a multi-color illustration do not fall exactly on top of one another, a blurred reproduction is produced. This is termed imperfect register. A halftone screen is like a cross-line grid and forms screen dots along straight lines at an angle of exactly 90° with each other.

When printing in black and white this crossline grid is positioned at an angle of 45° with regard to the eyes of the reader and is almost imperceptible. If two such crossline grids are printed above one another this may result in a noticeable frame formation which is called moire pattern. The smaller the angle between the lines, the more noticeable the moire pattern and vice versa. At an angle of 30°, the effect is not visible; however, in four-color printing it is impossible to print all the colors at 30° angles. Two colors must, accordingly, be positioned at the same angle or some colors at an angle of only 15° or at an angle of 22.5°, and some moire pattern must be accepted in certain cases.

With intaglio printing the ratio between line and well is usually equal to 2:5, and with a sucking printing ink the screen pattern more or less merges so that screen angles are not a matter of concern. The same advantage is obtained by the screen-less color printing technique with which the present invention is concerned.

SUMMARY OF THE INVENTION

According to the present invention, color-separation negatives are prepared from a color original, whether a transparency or opaque, by conventional techniques, using panchromatic continuous-tone film for the color-separation negatives. These negatives are prepared so that they will have a density range which does not exceed 1.0. From each negative there is prepared on continuous-tone orthochromatic film a grey mask by exposure and contact with said negative under conditions such that the grey mask has a density range which is 40–80% of the density range of the corresponding color-separation negative. This color-separation negative is termed an intermediate negative. From the intermediate negative is prepared a positive by illumination through a stack including said intermediate negative, the grey mask and one or more diffusion foils or films, the positive being on lithographic ortho film.

A second grey mask is prepared on continuous-tone ortho film from the positive by exposure and contact therewith, the second grey mask being prepared under conditions such that it has a density range of 30–40% of the density range in the positive. A final negative is prepared on a lith ortho film by exposure through a new stack which includes the second grey mask, the positive and the second lith ortho film. The exposure period is divided into a first portion which includes 85–90% of the total exposure time after which the second grey mask is removed from the stack and the lith ortho film is exposed for the remaining 10–15% of the total exposure time. The final negatives or positives obtained as described may be used for preparing printing forms for color printing. Duplication negatives on duplication film may also be prepared by this procedure for making a positive and from that a "Cromalin" test print.

The color-separation negatives in general are prepared on panchromatic film having an ASA value of 40–50. However, preferably, pan films having ASA value of 100–1200 ASA value are used, and the film is prepared under conditions such that the silver is deposited in coarse crystals with well-defined interstices therebetween. Also, the density range of the color-separation negative must not exceed 1.0 and should preferably not exceed 0.8.

Suitable density ranges for the four separation negatives generally used, namely, yellow, red, blue and black, as prepared by the present process are as follows:
Yellow: 1.12−0.45=0.67 (the density range)
Red: 1.21−0.43=0.78
Blue: 1.02−0.26=0.76
Black: 1.14−0.40=0.74.

Accordingly, an object of the present invention is a method of preparing screenless negatives and positives useful for the preparation of printing forms for multi-color printing.

Another object of the present invention is a method of preparing color-separation negatives useful at intermediate stages for preparation of final negatives and positives useful for preparation of printing forms for multi-color printing.

An important object of the present invention is a method of preparing grey mask of controlled density from intermediate color-separation negatives and positives for use in the preparation of final negatives and positives to be employed in the preparation of printing forms for multi-color printing without employing halftone screens.

An important object of the present invention is a method of preparing duplication negatives and positives for use in multi-color printing where the entire method is free of the necessity for use of halftone screens.

Particularly important objects of the present invention are intermediate color-separation negatives and positives, grey mask, final negatives and positives and duplication negatives and positives where all of such components are free of evidence of the use of halftone screens, said components being useful in continuous-tone multi-color printing.

Particularly significant objects of the present invention are components prepared by the methods detailed above and hereinafter.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 1A through 1E′ show a first embodiment of a method of preparing components in accordance with the present invention;

DESCRIPTION OF THE PREFERRED EMBODIMENTS

Figure 2A:
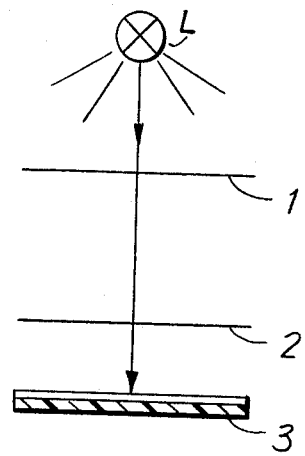
FIGS. 2A through 2D show a second embodiment of a method of preparing components in accordance with the present invention.
Figure 2B:
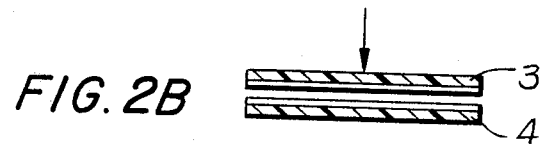
Figure 2C:
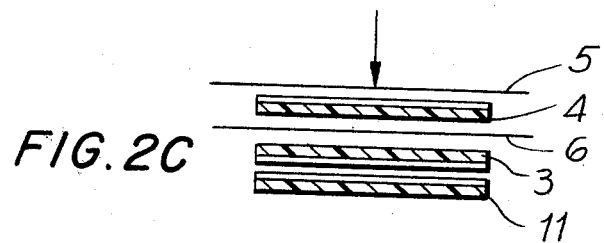
Figure 2C:
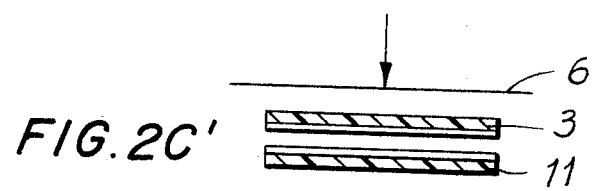

Thus, the invention relates to a process of making negatives or positives suitable for use in multi-color printing, comprising the use of a negative film for color separation from a color positive as the original, and the process is characterized in that on a continuous tone film of the panchromatic (Pan) type there is prepared a color-separation negative having a density range of not above 1.0, and on a continuous-tone orthochromatic (ortho) film there is prepared a grey mask from the color-separation negative by exposure in contact therewith under conditions such that the grey mask has a density range which is 40–80% of the density range of of the color-separation negative, after which there is prepared on a lith ortho film a positive by exposure through a stack which in the direction from the light source for illumination of the stack and exposure of the lith ortho film is as follows:

(a) a first light-diffusion foil or film having one matte face which faces the light source;

(b) the grey mask with the emulsion layer facing the light source;

(c) optionally another light-diffusing foil or film also with its matte face facing the light source;

(d) the color-separation negative with its emulsion layer facing away from the light source; and (e) the lithographic (lith) ortho film with its emulsion layer facing the light source. This film, after development, is a positive.

A second grey mask is prepared on a continuous tone ortho film from the positive by exposure in contact therewith, so that said second grey mask has a density range of 30-40% of the density range of the positive. A final negative on a lith ortho film is prepared by exposure through a new stack which in the direction from the light source for illumination of the stack and exposure of the lith ortho film consists of:

(f) the second grey mask with its emulsion layer facing the light source;

(g) the positive with its emulsion layer facing away from the light source; and (h) a second lith ortho film with its emulsion layer facing the light source, and illuminating this stack so that the lith ortho film is exposed for 85-90% of the necessary exposure time, removing the second grey mask from the stack and exposing the lith ortho film for the remaining 10-15% of the necessary exposure time, and developing, fixing, rinsing and drying the exposed lith ortho film in the normal manner thereby obtaining a final negative which, if desired, may be used for the preparation of a final positive in contact with the negative.

The final negatives or positives obtained by the present process may be used for transfer to printing forms for all existing printing processes, i.e. relief, gravure (intaglio), planographic (offset, lithography) and porous printing (screen printing).

If it is desired to prepare a final positive from the final negative, e.g. in order to make a "Cromalin" test print, this is prepared in contact with the negative in the usual manner.

The present process is carried out for making a final negative for each color to be used in the multi-color printing. Thus, for four-color printing color-separation negatives are prepared from the color original, which preferably is a color-positive transparency but which may also be a light-reflecting original (color copy) by separate exposures through a red filter, a green filter and a blue filter respectively, and a black correction negative is also made.

For making the color-separation negatives by the present process, continuous-tone films of the panchromatic (Pan) type, generally having an ASA value of 40-50 are used, as aforenoted. If a relatively coarse silver grain formation or crystal formation is desired on the color-separation negative, Pan films having higher ASA values are used. The Pan type for the color separation negatives may thus have as high a sensitivity as 100-1200 ASA. However, it is difficult to establish a definite lower and upper limit for the ASA values which the Pan films used for preparing the color separation negatives may have. The more sensitive the film, the coarser the crystals formed on the color separation negative under otherwise equal conditions.

However, it is a requirement for the color-separation negative that its density range (gradation) must not exceed 1.0, and the density range should preferably not be above about 0.8. This is a density range which is considerably lower than the usual density range (1.6-1.8) of color-separation negatives for later use in screened multi-color printing. Thus, the color-separation negatives prepared by means of the present process have a soft gradation which results from the fact that the range of grain sizes on these color separation negatives is strongly extended compared with the range on conventional color-separation negatives of hard gradation. This extended range of grain size is of significant importance for obtaining a final negative or positive which upon reproduction on printing forms makes these suitable for multi-color printing without the use of a screen.

The conditions used when preparing the color-separation negatives vary with the sensitivity of the continuous-tone film of the Pan type used for the separations. In order to obtain coarse silver grains on these films it is the general rule that films of higher ASA value yield coarser grains or crystals under otherwise equal conditions. Further, an increase in the temperature of the liquid developer (when developing the color separation negatives) will yield coarser grains. A normal temperature of the liquid developer is about 20° C.; however, it may be increased to 24° to 28° C. and even up to 30° C. Further, an increased rinsing time in water for the developed and fixed separation films will yield coarser grains, in the same manner as a higher temperature (up to 40° at most) and consequently a shorter drying period for the rinsed films. A normal rinsing time in water is about 10 minutes, however, it may be increased up to 0.5 hours and even up to 1 hour.

The use of one or more of these expedients in order to obtain a coarser grain formation is typical e.g., in the preparation of films to be used for reproduction onto printing forms for newspaper printing, i.e. relief rotation printing, where normal screen fineness should not exceed 24 lines per linear cm.

As an example, when using a continuous-tone film of the Pan type having an ASA value of about 40 for the preparation of the color-separation negatives, a temperature in the liquid developer (paper developer) of 20°-30° C. will be suitable. Upon development, the film is fixed, and the fixed film is then rinsed in water. This rinsing may be carried out for up to 1 hour with a film of the mentioned ASA value. After rinsing, the color-separation negatives are dried under dust-free conditions and with uniform circulation of air; this may most conventionally be done in a drying cabinet. The temperature in the drying cabinet should not exceed 40° C. and should preferably be between 30° and 40°. As mentioned, it is the general rule that the more rapid the drying, i.e., the higher the temperature, the coarser the grains obtained on the film. However, if a temperature above 40° C. is used this may detrimentally affect the dimensional stability of the film, and this is undesirable because all the steps disclosed for the present process must be carried out in exact register and with good vacuum contact. A drying period of about 10 minutes at a temperature of about 35°-40° C. has been found to be suitable for the color-separation negatives.

To the trained eye the (intermediate) color-separation negative will not appear as a conventional color-separation negative but will have a more marked crystal formation, particularly at the ends of the grey tonal scale in question, than a color-separation negative prepared in the conventional manner. Between the relatively coarse silver crystals on the color-separation negatives there are light-penetratable openings or interstices which are of importance for blackening the positives to be prepared from the color separation negatives.

These openings are to be transferred to the film for the positives as black dots (which are dots which upon transfer to the respective printing forms will serve as printing elements much as the screen elements), and as film for the positives a very hard film of the lith type is used, e.g., of the type "Orto Sakura OS", and it is important that all openings be transferred to the hard lith film so as to become equally strong, however, of course varying in size and groupings.

The preparation of the grey mask from the color-separation negatives obtained is a significant feature of the present invention. As known, the tonal range ("density range") of an image may be found by measuring the so-called density of the next darkest and the next lightest point of the image and subtracting these values. As an example of suitable density ranges for the four separation negatives, yellow, red, blue and black, prepared by the present process, the following ranges may be stated with their pertinent density values:

Yellow: 1.12–0.45=0.67 (the density range)
Red: 1.21–0.43=0.78
Blue: 1.02–0.26=1.76
Black: 1.14–0.40=0.74.

The color-separation negatives are so-called "flat" negatives. In order to obtain a harmonically-built grey tone (in the form of blackened crystals on the negatives) the grey mask is adjusted using the present process with regard to the range of the respective color-separation negatives (40–80% thereof). The highest percentage range is usually given the grey mask for the color-separation negative which according to the color original represents the most important color, whereas the grey mask for the black separation negative is given the lowest value. It is the general rule that the higher the mask percentage, the richer becomes the tonal scale and vice versa.

The preparation of the mask is dependent upon high purity and uniform development and should be carried out as follows:

A continuous-tone ortho film is placed with its emulsion side up. The color-separation negative is placed above the ortho film with its emulsion side down. Point illumination is used for exposing the continuous tone ortho film through the color separation negative.

The exposed mask film is placed in pure water which should be at the same temperature as the liquid developer. After the emulsion has been soaked through (10–15 seconds), the exposed mask film is placed in the liquid developer which should be normal or slightly softer than normal (dependent upon the type of the original). Development is carried out under continuous movement (agitation) for 1 to 3 minutes (dependent upon the type of the original and the contrast of the color-separation negative) after which the developed film is placed in a stop bath as soon as possible. After a few seconds in the stop bath the film is transferred to a fixing bath with some movement during the first seconds (the normal process). Then normal rinsing in water and normal drying in a drying cabinet are carried out.

The final mask must be very pure and very uniformly developed. No areas thereon must be mottled because by means of the mask a "screen" in the form of crystals will be produced in the course of the subsequent stack exposure.

For all phases of the present process films from various producers (Kodak, Agfa, DuPont, Sakura, etc.) may be used. Accordingly, the present process is not dependent upon the use of films from particular producers; however, the more specific disclosures presented herein are based on results obtained with the following films:

(a) Agfa Geavart Pan-films for the separations;
(b) Kodak continuous-tone ortho film (gravure film) for the grey masks; and
(c) Sakura Lith ortho film for the positives and final negatives.

When using other film brands some minor amount of experimenting must be made until one has become familiar with the "personal character" of the films. When the grey masks have been prepared with the desired density range with regard to the density ranges of the respective color-separation negatives, the masks are used in the preparation of the corresponding positives on the lith ortho film using the present stack exposure. The stack must be centralized with respect to the light source as a relief effect might else be caused. Of course, a good vacuum contact between the various components of the stack must also be present. The stack is given the necessary exposure. If it is desired to increase the contrast, the uppermost diffusion foil (when using two diffusion foils) and the grey mask may be removed and then exposing the stack further e.g. 5–8% of the total exposure time. When only one diffusion foil is used, only the grey mask is removed prior to the remaining exposure. The use of two diffusion foils may cause a relief effect, but in some cases provides easier control of the process as well as finer detail.

In the development of the lith ortho film a lith developer is used. It is recommended to agitate for the first ¼ of the development time, and then to develop further in a so-called stagnant bath. The crystal formation may then easily be observed; however, great care should be exercised toward the end of the development because the process then proceeds very rapidly, and it is of importance that control of the degree of crystal formation not be lost. When the extent of crystal formation based on experience is satisfactory, the film is placed in a stop bath for rapidly stopping the process. The film is then fixed, rinsed and dried in the normal manner.

The use of diffused illumination when exposing the film for the positive is an essential feature of the present invention. As diffusion foil or diffusion film "a tracing film" of polyester or a similar film may be used. The diffusion foil serves to convert the direct light into diffused light and provides that the light is spread in all directions. Under such light the light-absorbing and light-diffusing ability of the crystals on the color separation negative is accentuated so as to obtain an exposure of the film uniformly distributed over the entire tonal scale.

After the preparation of the positive it will appear that all tonal transitions thereon will consist of blackened dots which correspond to the openings between the silver crystals on the corresponding color-separation negative. The highlights on these positives are so weak (insufficiently blackened) that they would have been "exterminated" by normal exposure onto a new lith film. In order to protect these highlights and transfer them to the final negative a second grey mask must be prepared on a continuous-tone ortho film so as to reach a density of 30–40% of the density of the "crystallized" positive. The preparation of this mask is not critical and may be visually controlled.

The second grey mask is then used for exposure of a second lith ortho film therethrough. Listing the components the direction from the light source, a new stack consisting of the new grey mask with the film emulsion layer facing the light source, the crystallized positive with the film emulsion layer facing away from the light source and the second lith ortho film with the emulsion layer facing the light source is prepared. Again, good vacuum contact must be provided and that the image is well centered with regard to the light source.

This stack is exposed so that 85–90% of the entire illumination period for this exposure phase is devoted to the shadows and intermediate areas on the positives. Then the grey mask is removed and the rest of the stack is exposed for the remaining 10–15% of the illumination time needed by the sensitive crystals (dependent upon the contrast desired). The longer the exposure with the grey mask, the more detailed will be the highlights. In this way it may be stated that the new grey mask is a contrast-controlling mask.

When the exposed second lith ortho film has been developed, fixed, rinsed and dried in the normal manner there is obtained a final negative with the openings between the blackened dots on the negative being clear and "healthy" enough over the entire tonal scale of the original to enable them to be transferred photomechanically to printing forms for any printing process.

According to a second embodiment of the present invention there may instead of the lithographic ortho film for preparing the positive from the color-separation negative be used a so-called "duplication" film for exposure in contact with the color-separation negative. Upon exposure, development, fixing, rinsing and drying of the duplication film there is obtained a "crystallized" negative which may then be used for the preparation of a positive which then is the end product of the process. The advantage of using such a duplication film is that the preparation of the second grey mask may be deleted and the positive obtained as the end product may be used directly for producing a "Cromalin" test print, i.e., one operation is saved for such a test print (converting the negative into the positive). It is also an advantage of this embodiment if the printing house uses positives for transfer to the printing form. Also then the conversion of the negative obtained by the first embodiment of the present process into a positive may be omitted. Such duplication films are available from several of the larger film producers.

The principles of the first embodiment of the present process are that

1. A color-separation negative of soft gradation is produced, i.e. with low density range ("flat" films) which involves a wide range of grains on the film (in opposition to hard-contrast negatives).

2. A grey mask is prepared with limited density range compared with the color-separation negative, in order to ensure a careful transfer of the openings between the grains on the color-separation negative as blackened areas on the lithographic ortho film which is used for the preparation of the "crystallized" positive.

3. A "crystallized" positive is prepared with the openings between the crystals on the corresponding color-separation negative transferred thereon so as to become equally strong, however, with varying size and grouping.

4. A new grey mask with reduced density range compared with the corresponding positive is produced in order to protect the highlights on the positive and enable transfer thereof to the final negative by exposure of a film for the final negative through the positive.

The principles of the second embodiment of the present process are the same as for the first embodiment of the present process as regards the above-mentioned steps (1) and (2), however, with the obvious amendment in step (2) that the openings between the grains on the color separation negative are not to be transferred as blackened areas to the duplication film because, obviously, upon exposure, development, fixing, rinsing and drying the duplication film shall represent a direct copy of the color-separation negative, however, with more strongly-defined crystal formation and better-defined clear openings between the crystals compared with the color-separation negative. Thus, in step (3) of the second embodiment of the present process a "crystallized" negative is produced which represents a copy of the color-separation negative used, however, with the crystals on the negative and the openings between these being more pronounced and well defined than on the color-separation negative. In step (4) of this second embodiment of the present process a final positive is produced by exposure of a film for the final positive through the "crystallized" negative (obtained on the duplication film) with or without the use of a grey mask.

The various steps of the first embodiment of the present process are schematically shown in FIGS. 1A through 1E', it being noted that the unhatched portions are the emulsion layers in each of the films. As shown in FIG. 1A, light from light source L traverses color positive 1 and a color filter 2 and exposes the negative separation film 3. In FIG. 1B the developed color-separation negative 3 is positioned against the film 4 with the emulsion layers on the two films facing each other to produce grey mask 4. In FIG. 1C a diffusion foil 5 with its matte face facing upwards, the obtained grey mask 4, a second diffusion foil 6 (optional) also with its matte face facing upwards, and the color-separation negative 3 are assembled with the positive lithographic ortho film 7 and illuminated. In FIG. 1C' an optional step is shown in which the first diffusion foil 5 and the grey mask 4 have been removed, and the positive lith film is exposed for the remaining period of the exposure time through a second diffusion foil 6 and the color separation negative 3. In FIG. 1D the production of a second grey mask 8 from the positive 7 is shown, and in FIG. 1E the main exposure of a new lithographic ortho film 10 is carried out through the second grey mask 8 and the positive 7. In FIG. 1E' the exposure of the new lithographic film 10 for the remainder of the period is made through the positive 7 after removal of the grey mask 8. This process is carried out for preparing each final negative, dependent upon the number of colors to be used in the subsequent multi-color printing process for which the final negatives are to be used. In the present process the various films and diffusion foils are arranged face-to-face and in contact in the various steps.

Figure 2D:
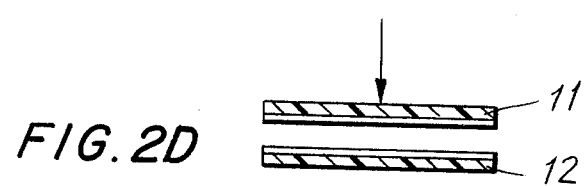

The various steps of the second embodiment of the present process have been shown schematically in FIGS. 2A through 2D using the same numerals for the same components as in FIGS. 1A through 1E'. The second embodiment of the present process is identical to the first embodiment up to and including the step shown in FIG. 1B. However, in the step of FIG. 2C, a duplication film 11 is exposed through a stack which otherwise is arranged as shown in FIG. 1C. In the optional step 2C' an additional exposure through the diffusion foil 6 and the color separation negative 3 is carried out, foil 5 and mask 3 having been removed. In the step of FIG. 2D, the film 12 for the final positive is exposed through the crystallized negative 11 for the entire necessary exposure time, i.e. as a consequence of the omission of the second grey mask (8 according to FIGS. 1A and 1D); the divided exposure according to steps of FIGS. 1E and 1E' are also omitted. However, when also using the second grey mask for the exposure of the positive film through the "crystallized" duplication film negative, the divided exposure may also be resorted to for the second embodiment of the process.

The present process may be termed a "crystal process" because through the chemical and photomechanical treatment of the films there is obtained a regrouping of the originally very small crystals in the film emulsion layers so that they form coarser and more fortified units which may be transferred photo-mechanically to printing forms for use in the subsequent printing process.

When using the negatives or positives obtained by means of the present process in connection with the above-mentioned printing processes there is obtained a color reproduction which is characterized therein that it is free of screen pattern and which, depending upon the conditions selected during the process selected for producing the final negatives or positives, will appear as a grainy color reproduction or a micro-grained color reproduction with variable contrast. This graininess may in this manner vary from a fineness corresponding to a screen of 12 lines per linear cm and up to a fineness of 300 lines per linear cm, dependent upon the treatments of the films. Thus, in the present process the desired end result is based, in large part, on the preparation of the intermediate color-separation negative. This opens up new possibilities of a more artistic influence upon color reproduction than hitherto possible using the conventional technical methods of reproduction (screen methods). The color reproductions obtained by using the negatives or positives after photomechanical transfer thereof to printing forms have high color intensity and a very high richness in details, and the present process allows the use of films of finer grain compared with the conventional screen process, makes it easier to carry out the desired amendments dependent upon the end result desired, and gives color reproductions of greater esthetic appear compared with color reproductions obtained by known methods (the technical screen). The printing as such is carried out in conventional manner.

The final negative and positive films obtained by the present process may be characterized as being screenless orthochromatic lithographic films with all tones from black to white formed by crystals in the film emulsion layer as such.

It will thus be seen that the objects set forth above, among those made apparent from the preceding description, are efficiently attained and, since certain changes may be made in carrying out the above methods and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention, which, as a matter of language, might be said to fall therebetween.

What is claimed is:

1. A method of manufacturing intermediate and final color-separation negatives and positives from a color original suitable for use in screenless printing, comprising the steps of:

exposing a continuous-tone panchromatic (pan) film including a silver halide emulsion through a selected filter to light from said color original and developing said film to a density not exceeding 1.0, said developed pan film being termed an intermediate color-separation negative, said development of said pan film being effected under conditions such as to produce silver crystals larger in size than produced in normal development, said conditions including at least one of the steps, (A) raising the temperature of the developer from its normal temperature by up to about 10° C., (B) increasing the time of rinsing by a factor of up to about 6, and (C) increasing the drying temperature up to a maximum of about 40° C. with the objective of increasing the size of the silver crystals formed in said development of said film;

placing said intermediate color-separation negative in contact with an orthochromatic continuous-tone film and exposing and developing said orthochromatic film to prepare a first grey mask having a density range of 40-80% of the density range of said intermediate negative;

exposing, and subsequently developing, a first lithographic (lith) orthochromatic film in a stack arranged as follows, the components in said stack being listed in order from the light source:
   (a) a first diffusion film having one matte surface and said matte surface facing toward said light source;
   (b) said first grey mask with the emulsion layer thereof facing toward said light source;
   (c) said intermediate color-separation negative with the emulsion layer thereof facing away from said light source; and
   (d) said first lith film with the emulsion side thereof facing toward said light source, said exposed and developed first lith film being an intermediate positive;

preparing a second grey mask by exposing an orthochromatic continuous-tone film through said intermediate positive and developing same to a density range of 30-40% of that of said intermediate positive;

preparing a second stack, the components of said stack being listed in order from a light source;
   (e) said second grey mask with the emulsion side thereof facing toward said light source;
   (f) said intermediate positive with the emulsion side thereof facing away from said light source; and
   (g) a second lith orthochromatic film with the emulsion side thereof facing toward said light source;

exposing said stack for 85-90% of the necessary time;
   removing said second grey mask from said second stack;
   exposing said stack for the remaining 10-15% of the necessary time; and
   completing the developing of said second lith film to produce a final negative, the term "developing" being taken to include actual developing, fixing, rinsing and drying.

2. The method as defined in claim 1, wherein said first stack further includes:

(h) a second light-diffusing film between said first grey mask and said intermediate color-separation negative, said second light-diffusing film having one matte surface and said matte surface facing toward said light source.

3. The method as defined in claims 1 or 2, wherein said process is carried out so that said intermediate color separation negative has a density range not exceeding 0.8.

4. The method as defined in claims 1 or 2, including the steps of preparing the four intermediate color-separation negatives, yellow with a density range of about 0.67, red with a density range of about 0.78, blue with a density range of about 0.76, and black with a density range of about 0.74.

5. The method as defined in claims 1 or 2, wherein the development of said first grey mask includes the substeps, subsequent to exposure, of
thoroughly soaking said first grey mask film in pure water;
developing said film with continuous-agitation for 1 to 3 minutes in a developer of at least normal softness, i.e., no harder than normal hardness;
stopping the development of said film in a stop bath;
fixing said film with agitation for at least the first few seconds; and
rinsing said film in water and drying same in a drying cabinet.

6. The method as defined in claim 2, wherein said exposure of said first lith film is carried out for 92 to 95% of the total exposure time, and further comprising the steps of then removing said first diffusion foil and said first grey mask and then exposing said first lith film for the remaining 8 to 5% of the total exposure time.

7. The method as defined in claim 1, wherein said exposure of said first lith film is carried out for 92–95% of the total exposure time, and further comprising the steps of then removing said first grey mask and then exposing said first lith film for the remaining 8–5% of the total exposure time, whereby the contrast of said intermediate positive is increased.

8. A method of manufacturing from a color original a duplication negative suitable for use in screenless color printing, comprising the steps of:
exposing a panchromatic (pan) continuous-tone film having a silver halide emulsion through a selected filter to light from said color original, and subsequently developing and drying said film, thereby producing an intermediate color-separation negative, said exposure, development and drying being carried out under conditions such that said intermediate negative has a density range not exceeding 1.0, and the silver grains produced are larger than produced under normal development and drying;
preparing on an orthochromatic continuous-tone film a grey mask from said intermediate negative by exposure in contact therewith and subsequent development under conditions such that said grey mask has a density range of 40–80% of that of said intermediate negative; and
exposing, and subsequently developing, a negative duplication film in a stack arranged as follows, the components in said stack being listed in order from the light source:
(a) a light-diffusion film having one matte surface, said matte surface facing toward said light source;
(b) said grey mask with its emulsion layer facing said light source;
(c) said intermediate color-separation negative with its emulsion layer facing away from said light source;
(d) said duplication film with its emulsion layer facing said light source;
said exposed and developed duplication film being said duplication negative.

9. The method as defined in claim 8, wherein said stack includes (e) a second light-diffusion film having one matte surface, said surface facing toward said light source, and said second light-diffusion foil being disposed between components (b) and (c).

10. The method as defined in claims 8 or 9, further comprising the step of preparing from said duplication negative a positive on lith orthochromatic film.

11. The method as defined in claims 8 or 9, further comprising the steps of preparing from said duplication negative on orthochromatic continuous-tone film by contact with said duplication negative a second grey mask of limited density range, assembling a stack for exposure to a light source, the components in said stack being as listed in order from the light source:
(f) said second grey mask with the emulsion side thereof facing toward said light source;
(g) said duplication negative with its emulsion side facing away from said light source; and
(h) a lithographic (lith) orthochromatic film with its emulsion layer facing toward said light source;
and exposing and developing said lith film color thereby forming a final positive useful for multi-color printing.

12. The method as defined in claim 11, wherein said limited density range is 30–40% of the density range of said duplication film negative.

13. The method as defined in claims 11 or 12, wherein the development of said second grey mask comprises the substeps of thoroughly soaking the exposed second grey mask film in pure water, placing the exposed mask film in a developer at least as soft as normal liquid developer and agitating continuously for 1–3 minutes, transferring same promptly to a stop bath for a few seconds, transferring to a fixing bath with agitation for the first few seconds in said bath, rinsing in water and drying in a drying cabinet.

14. The product of the process defined in claim 3.
15. The product of the process defined in claim 4.
16. The product of the process defined in claim 5.
17. The product of the process defined in claim 10.
18. The product of the process defined in claim 11.

19. The method of claim 1 or 8, wherein said panchromatic film has an ASA value in excess of about 40–50 and up to a maximum of about 1200, an increase in the ASA value contributing to an increase in the size of the silver crystals produced during exposure, development and drying.

20. The product of the process as defined in claim 1.
21. The product of the process as defined in claim 2.
22. The product of the process as defined in claim 6.
23. The product of the process as defined in claim 7.
24. The product of the process as defined in claim 8.
25. The product of the process as defined in claim 9.
26. The product of the process as defined in claim 12.

27. The method as claimed in claim 1, further comprising the step of preparing a final positive from said final negative.

* * * * *